United States Patent
Datla Jagannadha et al.

(10) Patent No.: US 10,473,720 B2
(45) Date of Patent: Nov. 12, 2019

(54) DYNAMIC INDEPENDENT TEST PARTITION CLOCK

(71) Applicant: NVIDIA CORPORATION, Santa Clara, CA (US)

(72) Inventors: Pavan Kumar Datla Jagannadha, Santa Clara, CA (US); Dheepakkumaran Jayaraman, Sunnyvale, CA (US); Anubhav Sinha, Telangana (IN); Karthikeyan Natarajan, Fremont, CA (US); Shantanu Sarangi, Saratoga, CA (US); Amit Sanghani, San Jose, CA (US); Milind Sonawane, San Jose, CA (US); Mahmut Yilmaz, Los Altos Hills, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 15/336,626

(22) Filed: Oct. 27, 2016

(65) Prior Publication Data
US 2017/0115351 A1   Apr. 27, 2017

Related U.S. Application Data

(60) Provisional application No. 62/247,195, filed on Oct. 27, 2015, provisional application No. 62/285,429, filed on Oct. 27, 2015.

(51) Int. Cl.
*G01R 31/3177* (2006.01)
*G01R 31/317* (2006.01)
(Continued)

(52) U.S. Cl.
CPC ..... *G01R 31/3177* (2013.01); *G01R 31/2607* (2013.01); *G01R 31/2803* (2013.01);
(Continued)

(58) Field of Classification Search
CPC .......... G01R 31/3177; G01R 31/31725; G01R 31/31724; G01R 31/31701
See application file for complete search history.

(56) References Cited

U.S. PATENT DOCUMENTS

| | | |
|---|---|---|
| 5,535,331 A | 7/1996 | Swoboda et al. |
| 5,656,963 A | 8/1997 | Masleid et al. |

(Continued)

*Primary Examiner* — Phung M Chung

(57) ABSTRACT

In one embodiment, a test system comprises: a plurality of test partitions and a centralized controller configured to coordinate testing between the plurality of test partitions. At least one of the plurality of test partitions comprises: a partition test interface controller configured to control testing within at least one test partition in accordance with dynamic selection of a test mode, and at least one test chain configured to perform test operations. The dynamic selection of the test mode and control of testing within a test partition can be independent of selection of a test mode and control in others of the plurality of test partitions. In one embodiment, a free running clock signal is coupled to a test partition, and the partition test mode controller transforms the free running clock signal into a local partition test clock which is controlled in accordance with the dynamic selection of the test mode.

12 Claims, 12 Drawing Sheets

(51) Int. Cl.
  *G01R 31/26* (2014.01)
  *G01R 31/28* (2006.01)
  *G01R 31/3185* (2006.01)
  *G06F 11/00* (2006.01)

(52) U.S. Cl.
  CPC ..... *G01R 31/2806* (2013.01); *G01R 31/2834* (2013.01); *G01R 31/31701* (2013.01); *G01R 31/31707* (2013.01); *G01R 31/31724* (2013.01); *G01R 31/31725* (2013.01); *G01R 31/318555* (2013.01); *G01R 31/318572* (2013.01); *G06F 11/00* (2013.01)

(56) References Cited

U.S. PATENT DOCUMENTS

| | | | |
|---|---|---|---|
| 5,805,608 | A | 9/1998 | Baeg et al. |
| 5,812,562 | A | 9/1998 | Baeg |
| 5,970,241 | A | 10/1999 | Deao et al. |
| 6,016,555 | A | 1/2000 | Deao et al. |
| 6,055,649 | A | 4/2000 | Deao et al. |
| 6,065,106 | A | 5/2000 | Deao et al. |
| 6,081,885 | A | 6/2000 | Deao et al. |
| 6,106,568 | A | 8/2000 | Beausang et al. |
| 6,112,298 | A | 8/2000 | Deao et al. |
| 6,163,583 | A | 12/2000 | Lin et al. |
| 6,192,092 | B1 | 2/2001 | Dizon et al. |
| 6,343,365 | B1 | 1/2002 | Matsuzawa et al. |
| 6,473,439 | B1 | 10/2002 | Zerbe et al. |
| 6,493,802 | B1 | 12/2002 | Razdan et al. |
| 6,586,921 | B1 | 7/2003 | Sunter |
| 6,622,255 | B1 | 9/2003 | Kurd et al. |
| 6,724,328 | B1 | 4/2004 | Lui et al. |
| 6,763,485 | B2 | 7/2004 | Whetsel |
| 6,785,856 | B1 | 8/2004 | Parker et al. |
| 6,813,739 | B1 | 11/2004 | Grannis, III |
| 6,949,958 | B2 | 9/2005 | Zerbe et al. |
| 7,015,741 | B2 | 3/2006 | Tschanz et al. |
| 7,046,174 | B1 | 5/2006 | Lui et al. |
| 7,093,150 | B1 | 8/2006 | Norman et al. |
| 7,245,684 | B2 | 7/2007 | Adkisson |
| 7,288,973 | B2 | 10/2007 | Zerbe et al. |
| 7,409,612 | B2 | 8/2008 | Van De Logt et al. |
| 7,447,961 | B2 | 11/2008 | Tan |
| 7,509,549 | B2 | 3/2009 | Larson et al. |
| 7,613,967 | B1 | 11/2009 | Tan |
| 7,831,856 | B1 | 11/2010 | Liu et al. |
| 7,984,369 | B2 * | 7/2011 | Sul ................ H03M 5/145 714/809 |
| 7,987,401 | B2 | 7/2011 | Pandey |
| 8,112,654 | B2 | 2/2012 | Bjerregaard |
| 8,205,182 | B1 | 6/2012 | Zlatanovici et al. |
| 8,438,437 | B2 * | 5/2013 | Jain ................ G01R 31/318547 714/726 |
| 8,694,844 | B2 | 4/2014 | Whetsel |
| 8,887,117 | B1 | 11/2014 | Chuang |
| 9,103,879 | B2 * | 8/2015 | Douskey ........ G01R 31/318544 |
| 9,116,205 | B2 * | 8/2015 | Douskey ........ G01R 31/318544 |
| 9,437,328 | B2 | 9/2016 | Yang |
| 9,459,651 | B2 | 10/2016 | Moheban et al. |
| 9,529,044 | B1 | 12/2016 | Taneja et al. |
| 9,733,308 | B2 | 8/2017 | Whetsel |
| 10,281,524 | B2 | 5/2019 | Chadalavda et al. |
| 10,317,463 | B2 | 6/2019 | Sonawane et al. |
| 2002/0162063 | A1 * | 10/2002 | Whetsel ........ G01B 31/318555 714/724 |
| 2002/0196886 | A1 | 12/2002 | Adkisson |
| 2002/0199124 | A1 | 12/2002 | Adkisson |
| 2003/0053489 | A1 | 3/2003 | Zerbe et al. |
| 2003/0229834 | A1 | 12/2003 | Cooke |
| 2004/0190665 | A1 | 9/2004 | Uratani et al. |
| 2004/0194109 | A1 | 9/2004 | Boros et al. |
| 2005/0024074 | A1 | 2/2005 | Benjamin et al. |
| 2005/0055617 | A1 | 3/2005 | Wang et al. |
| 2005/0102643 | A1 | 5/2005 | Hou et al. |
| 2005/0209805 | A1 | 9/2005 | Chang et al. |
| 2005/0234674 | A1 * | 10/2005 | Bundy ............ G01R 31/31919 702/119 |
| 2005/0242836 | A1 | 11/2005 | Goetting et al. |
| 2005/0262492 | A1 | 11/2005 | Goetting et al. |
| 2006/0022724 | A1 | 2/2006 | Zerbe et al. |
| 2006/0026473 | A1 | 2/2006 | Patrick Tan |
| 2006/0095818 | A1 | 5/2006 | Bratt et al. |
| 2006/0149987 | A1 | 7/2006 | Klowden et al. |
| 2007/0106923 | A1 | 5/2007 | Aitken et al. |
| 2007/0300001 | A1 | 12/2007 | Dirscherl et al. |
| 2008/0008015 | A1 | 1/2008 | Darbinyan et al. |
| 2008/0034334 | A1 | 2/2008 | Laouamri et al. |
| 2008/0046770 | A1 | 2/2008 | Jong et al. |
| 2008/0276116 | A1 | 11/2008 | Bjerregaard |
| 2009/0150709 | A1 | 6/2009 | Arnold et al. |
| 2009/0184735 | A1 | 7/2009 | Wicki et al. |
| 2010/0223519 | A1 * | 9/2010 | Swoboda ........ G01R 31/31705 714/733 |
| 2010/0235698 | A1 | 9/2010 | Diewald et al. |
| 2011/0099442 | A1 * | 4/2011 | Hales ............ G01R 31/318533 714/729 |
| 2011/0221469 | A1 | 9/2011 | Schlagenhaft |
| 2012/0117436 | A1 | 5/2012 | Portolan et al. |
| 2012/0146535 | A1 | 6/2012 | Lee et al. |
| 2012/0159276 | A1 | 6/2012 | Zandian et al. |
| 2013/0159800 | A1 | 6/2013 | Ravi et al. |
| 2013/0194016 | A1 | 8/2013 | Wimer |
| 2014/0089750 | A1 * | 3/2014 | Douskey ........ G01R 31/318544 714/729 |
| 2014/0157067 | A1 | 6/2014 | Yang |
| 2014/0247080 | A1 | 9/2014 | Moheban et al. |
| 2014/0292385 | A1 | 10/2014 | Bahl et al. |
| 2014/0298125 | A1 | 10/2014 | Devadze et al. |
| 2015/0046763 | A1 | 2/2015 | Makar et al. |
| 2015/0178102 | A1 * | 6/2015 | Regner ................ G06F 13/14 713/100 |
| 2015/0220470 | A1 | 8/2015 | Chen et al. |
| 2015/0229469 | A1 | 8/2015 | Hainz |
| 2016/0070619 | A1 | 3/2016 | Moran et al. |
| 2017/0115338 | A1 | 4/2017 | Chadalavda et al. |
| 2017/0115345 | A1 | 4/2017 | Sonawane et al. |
| 2017/0115346 | A1 | 4/2017 | Sonawane et al. |
| 2017/0115352 | A1 | 4/2017 | Jayaraman et al. |
| 2017/0115353 | A1 | 4/2017 | Sonawane et al. |
| 2017/0133070 | A1 | 5/2017 | Ware et al. |
| 2017/0195754 | A1 | 7/2017 | Grambichler et al. |
| 2017/0205465 | A1 | 7/2017 | Sarangi et al. |
| 2017/0269145 | A1 * | 9/2017 | Whetsel ........ G01B 31/318513 |
| 2018/0122444 | A1 | 5/2018 | Ware et al. |

* cited by examiner

Traditional Architecture

Dynamic Clocking Architecture

900

910
A test mode selection for a first partition is accessed.

920
Testing of the first partition is controlled in accordance with the test mode selection for the first partition independent of a test mode selection for a second partition.

930
Test operations are performed in the first partition in accordance with the controlling.

Fig. 9

DYNAMIC INDEPENDENT TEST PARTITION CLOCK

RELATED APPLICATIONS

This application claims priority to and the benefit of following applications:

U.S. Provisional Application Ser. No. 62/247,195, filed on Oct. 27, 2015, entitled "SCANS SYSTEMS AND METHODS"; and U.S. Provisional Application Ser. No. 62/285,429, filed on Oct. 27, 2015, entitled "SCANS SYSTEMS AND METHODS";

which are all hereby incorporated by reference in their entirety for all intents and purposes.

FIELD OF THE INVENTION

The present invention relates to the field of circuit testing. In one embodiment, granular dynamic test systems and methods are utilized to generate partition test clocks.

BACKGROUND

Numerous electronic technologies such as digital computers, video equipment, and telephone systems have facilitated increased productivity and reduced costs in processing information in most areas of business, science, and entertainment. Testing the components is typically an important activity in ensuring proper performance and accurate results. The testing of semiconductor devices often involves performing test operations in accordance with controls referred to as test patterns. Execution of the test patterns typically involves loading and unloading scan chains with test vectors. However, there are a number of factors that can impact testing and traditional testing approaches are often costly and inefficient.

A system on chip (SoC) design is typically composed of several blocks of circuitry, some of which may have similar designs that are used or replicated in different parts of the chips. The several blocks of circuitry are often configured or organized in test blocks or test partitions for purposes of testing the circuitry. Traditional approaches to generating a full set of conventional test patterns targeted at multiple test partitions and executing the test patterns at substantially similar or parallel times is computationally intensive and time consuming. These conventional attempts are often unable to meet limited cost budgets and constrained project schedules.

Transistor feature sizes continue to shrink and smaller transistors allow more circuits to be included in a given die area. Although transistor technological advances offer a number of advantages, they also create design-for-testability (DFT) challenges. In traditional scan based tests, a significant portion of test time is spent loading and unloading test patterns or test vectors in the scan chains for application of test vectors. Larger and more complex circuits usually require longer test times. Conventional attempts at reducing test times by increasing shift clock frequencies or testing the entire design at the same time are often problematic and ineffective. Conventional test architectures are typically limited to supporting only one type of test vector across test partitions and don't typically enable parallel or true concurrent testing. For example, conventional solutions do not usually enable automatic test equipment and circuits under test to concurrently run a memory test in one test partition and scan test in another test partition. In a complex system-on-chip (SoC), interdependence of the clocking architecture across blocks and overall peak power consumption limits are typically major bottlenecks that hinder or prevent conventional independent parallel testing at a higher clock frequency.

SUMMARY

In one embodiment, a test system comprises: a plurality of test partitions and a centralized controller configured to coordinate testing between the plurality of test partitions. At least one of the plurality of test partitions comprises: a partition test interface controller configured to control testing within at least one test partition in accordance with dynamic selection of a test mode, and at least one test chain configured to perform test operations. The dynamic selection of the test mode and control of testing within a test partition can be independent of selection of a test mode and control in others of the plurality of test partitions. In one embodiment, a free running clock signal is coupled to a test partition, and the partition test mode controller transforms the free running clock signal into a local partition test clock which is controlled in accordance with the dynamic selection of the test mode. The partition test interface controller can generate a local partition scan enable signal, scan shift clock signal and scan capture clock signal. The local scan capture clock signal can be derived from the output of phase lock loop (PLL). The test operations can be associated with a variety of tests (e.g., a Joint Test Action Group (JTAG) test, a scan test, a Memory Built In Self Test (MBIST), an Input/Output Built In Self Test (IOBIST), etc.). The partition test interface controller can include a finite sate machine and a clock gate.

In one embodiment, a method of testing different partitions of a chip in independent test modes is implemented. The method comprises: accessing a test mode selection for a first partition; controlling testing of said first partition in accordance with said test mode selection for said first partition independent of a test mode selection for a second partition; and performing test operations in said first partition in accordance with said controlling. The test mode selection for the first partition can be different than the test mode selection for the second partition. At least a portion of the test operations can be performed in the first partition concurrently with a portion of test operations in the second partition. A first type of test vectors can be supplied to the first partition and a second type of test vectors can be supplied to the second partition. In one exemplary implementation, the test operations of the first partition are scheduled independent of the test operation of the second partition. The test operations of the first partition can be in a different phase than test operations of the second partition. A free running clock can be supplied to the first partition and second partition. A first test clock for the first partition can be derived from the free running clock independent of a second test clock for the second partition, and the second test clock for the second partition can be derived from the free running clock independent of the first clock for the first partition.

In one embodiment, a test system comprises: a first test partition configured to execute a first test pattern; a second test partition configured to execute a second test pattern, wherein the second test partition executes at least a portion of the second test pattern in parallel with execution of at least a portion of the first test pattern on the first test partition, and the portion of the second test pattern and the portion of the first test pattern are associated with different test modes; and a centralized controller configured to coordinate testing between the plurality of test partitions. The coordination includes managing communication of test information between the plurality of test partitions and external pins. The second test partition can include a test partition interface controller coupled to a free running clock signal from a single external pin. The test partition interface controller can derive a local test clock signal that is different than the free running clock signal. The second test pattern can be reused for a third test partition that has a shared partition designed with the second test partition. Test operations associated with different test modes can be aligned non-sequentially between the first test partition and the second test partition.

DESCRIPTION OF THE DRAWINGS

The accompanying drawings, which are incorporated in and form a part of this specification, are included for exemplary illustration of the principles of the present invention and not intended to limit the present invention to the particular implementations illustrated therein. The drawings are not to scale unless otherwise specifically indicated.

FIG. 9 is a block diagram of exemplary test method in accordance with one embodiment.

DETAILED DESCRIPTION

Figure 1:
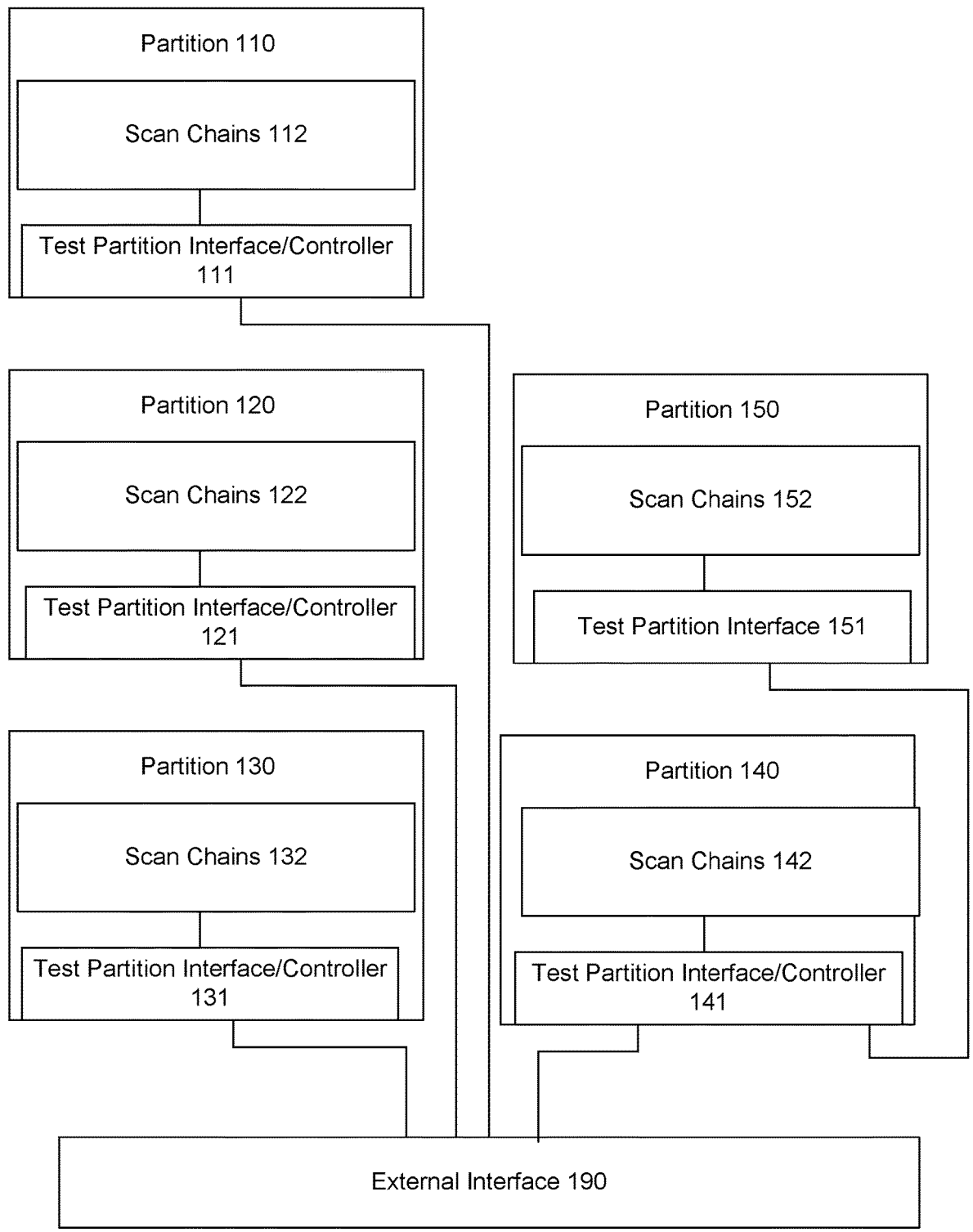
FIG. 1 is a block diagram of an exemplary test system in accordance with one embodiment.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Efficient and effective granular dynamic test systems and methods are presented. In one embodiment, the granular dynamic test systems and methods enable flexible adjustment and adaptability to a variety of different conditions that arise during testing. The granular dynamic test systems and methods can enable flexible and dynamic generation of clock signals that are compatible with a variety of test operations (e.g., execution of different types of tests, different test modes, etc.). The different types of tests can include conventional Automatic Test Pattern Generation (ATPG), Memory Built In Self Test (MBIST), Input/Output Built In Self Test (IOBIST), and so on. The tests can also include different test modes associated with different test operations (e.g., functional operations, shift operations, capture operations, etc.). In one exemplary implementation, the different types of tests and test modes can be executed in parallel or concurrently across various circuits or sections of a die. The flexible adjustment and adaptability facilitate conservation of resources and improved testing performance.

Partition Testing Approach

In one embodiment, circuits under test in a System On a Chip (SOC) design are configured or organized into a hierarchy of groups or sets of circuitry. A functional circuit and associated test circuitry are organized into test units or cells. The test units are coupled together into scan chains and the scan chains are configured or organized into test partitions or test blocks. The test partitions and components therein can be organized based on a variety of factors (e.g., components involved in a type of function, particular design of the circuitry, intellectual property, size, portion of die area, number of functional components, electrical characteristics, safety limitations, power consumption, etc.).

While the organization of test operations based upon test partitions does offer greater testing granularity, the increased number of test partitions and the many possible different test characteristics and features of the test partitions gives rise to very complex and complicated test environments. The presented granular dynamic testing systems and methods are configured to facilitate testing of the different complex characteristics and factors associated with the multiple test partitions in an efficient and effective manner.

FIG. 1 is a block diagram of test system 100 in accordance with one embodiment. Test system 100 includes test partition 110, test partition 120, test partition 130, test partition 140, test partition 150 and external interface 190. Test partitions 110, 120, 130, 140, and 150 include scan chains 112, 122, 132, 142, and 152 respectively. Test partitions 110, 120, 130, and 140 include test partition interfaces/controllers 111, 121, 131, and 141. In one embodiment, test partitions 140 and 150 are very similar and are considered to be similar IP or functionally equivalent. As such, the test partition interface/controller 141 can be considered to provide control operations for test partition 150 via test partition interface 151. In one embodiment, test partition interface/controller 141 is considered a centralized controller for both test partition 140 and test partition 150. Test partition interface 151 can be less complex than test partition interface/controller 141 (e.g., test partition interface 151 has less controls and is considered an interface rather than interface/controller). It is appreciated that test system 100 can have a variety of configurations. In one embodiment, there are some test interface and control operations that can be performed by a centralized controller even if the partitions are not similar (e.g., do not have same IP, are not functionally similar, etc.).

Figure 2:
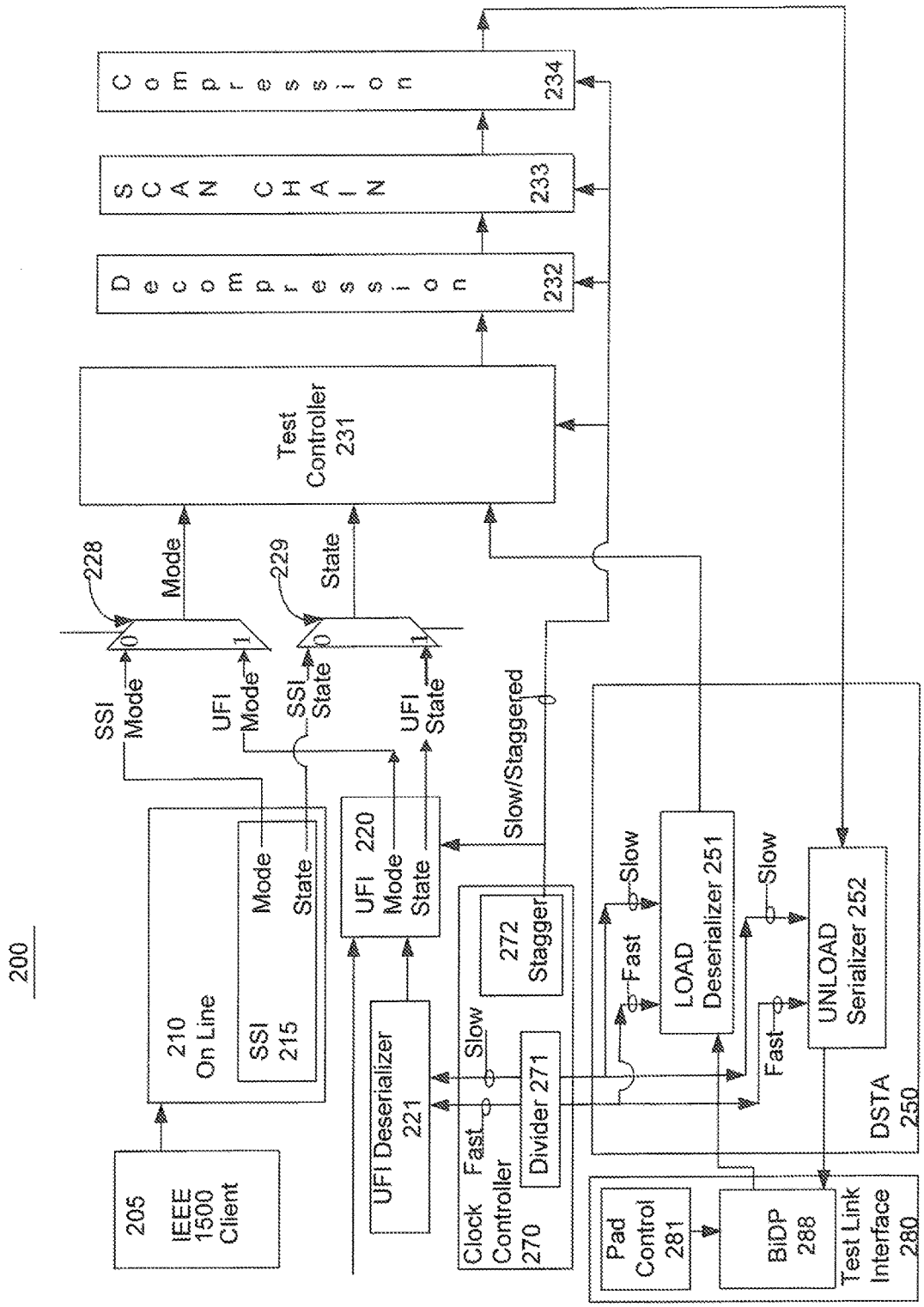
FIG. 2 is a block diagram of an exemplary system in accordance with one embodiment.

FIG. 2 is a block diagram of an exemplary system 200 in accordance with one embodiment. System 200 can operate as a test partition interface/controller. In one exemplary implementation, system 200 is similar to a test interface/controller 111 or 121. System 200 includes IEEE 1500 client interface 205, On Line module 210, Ultra Fast Interface (UFI) controller 220, UFI de-serializer 221, mode MUX 228, State MUX 229, Test Controller 231, Scan Decompression Component 232, Scan Chain Component 233, Scan Compression Component 234, Dynamic Scan Test Access (DSTA) Component 250, Clock Controller 270 and Test Link Interface 280 and Bi-Directional Pads 288. Mode MUX 228 and State MUX 229 are coupled to Test Controller 231, Ultra Fast Interface (UFI) controller 220 and On Line module 210 which is coupled to IEEE 1500 client interface 205. UFI 220 is coupled to UFI de-serializer 221. Clock controller 270 is coupled to Ultra Fast Interface (UFI) controller 220, UFI de-serializer 221, Test Controller 231, Scan Decompression Component 232, Scan Chain Component 233, Scan Compression Component 234, and DSTA 250. DSTA 250 is coupled to Bi-Directional Pads 288 which are in Test Link Interface 280. On Line module 210 can include SSI 215. Clock Controller 270 can include divider 271 and stagger 272. DSTA 250 can include load component 251 and unload component 252.

In one embodiment, UFI de-serializer 221 receives an ultra fast serial signal and de-serializes the signal into separate signals that are forwarded to the UFI module 220. UFI module 220 generates UFI mode information and UFI state information which is fed into mode MUX 228 and State MUX 229 respectively. On Line module 210 receives signals from IEEE 1500 client interface 205 and generates SSI mode information and SSI state information which is fed into mode MUX 228 and State MUX 229 respectively. Mode MUX 228 selects either the UFI mode information or SSI mode information and forwards the selected information to Test Controller 231. State MUX 229 selects either the UFI state information or SSI state information and forwards the selected information to Test Controller 231.

Test controller 231 organizes the test signals and forwards them to Scan Decompression Component 232. Scan Decompression Component 232 decompresses the signals and forwards them to Scan Chain Component 233. Scan Chain Component 233 performs the scan test operations (e.g., scan shift, scan capture, etc.) and forwards the results to Scan Compression Component 234. Scan Compression Component 234 compresses the test results and forwards the compressed test results to DSTA 250. DSTA 250 receives scan test input data from external connections of bi-directional pads 288 and forwards scan test output data to external connections of bi-directional pads 288. Test Link Interface 280 includes pad direction controller 281 that controls the communication direction of Bi-Directional Pads 288. Clock controller 270 generates clocks signals.

In one embodiment, the clock signals are coordinated in accordance with the rates of input and output signals of the various components. In one exemplary implementation, Clock controller 270 receives a single free flowing clock input and generates a fast internal clock, a slow internal clock and a slow staggered internal clock. The fast internal clock and slow internal clock are forwarded to the UFI deserializer 221, LOAD deserializer 251, and UNLOAD serializer 252 for use in respective deserializing/serializing operations. The slow staggered internal clock is forwarded to Test Controller 231, Scan Decompression Component 232, Scan Chain Component 233 and Scan Compression Component 234 for clocking the test operations of the respective components.

Core Based Design for Test (DFT)

In one embodiment, a granular dynamic test system includes features of a core based design for test (DFT) approach at the partition level and test pin reduction at the chip level. The core based DFT approach involves multiple test partitions that communicate information with other internal and external components. The granular dynamic test systems and methods include standardized test partition interfaces configured to coordinate the communication of the information to and from the partitions. The standardization of common features of the test partition interfaces enables flexible and scalable test solutions that facilitate independent parallel testing operations. The granular dynamic test system and method can be configured in a plug and play type architecture.

In one embodiment, the granular dynamic test systems and methods use a core based DFT plug and play test architecture approach, wherein test partitions are wrapped in IEEE 1500 Wrapper Boundary Register (WBR) cells. The WBR cells are compatible with removal of test partition inter-dependency for test pattern generation. A customized and standard reduced pin test interface can be utilized to provide high speed point-to-point scan access to each test partition. In one exemplary implementation, the interface is compatible with third party EDA tools as well. The complete details of the point-to-point interface and the IEEE 1500 WBR methodology are not presented so as to not obfuscate the invention. An exemplary high level overview is illustrated in FIG. 3 to help describe the need for an effective and efficient methodology of granular dynamic test systems and methods.

Figure 3:
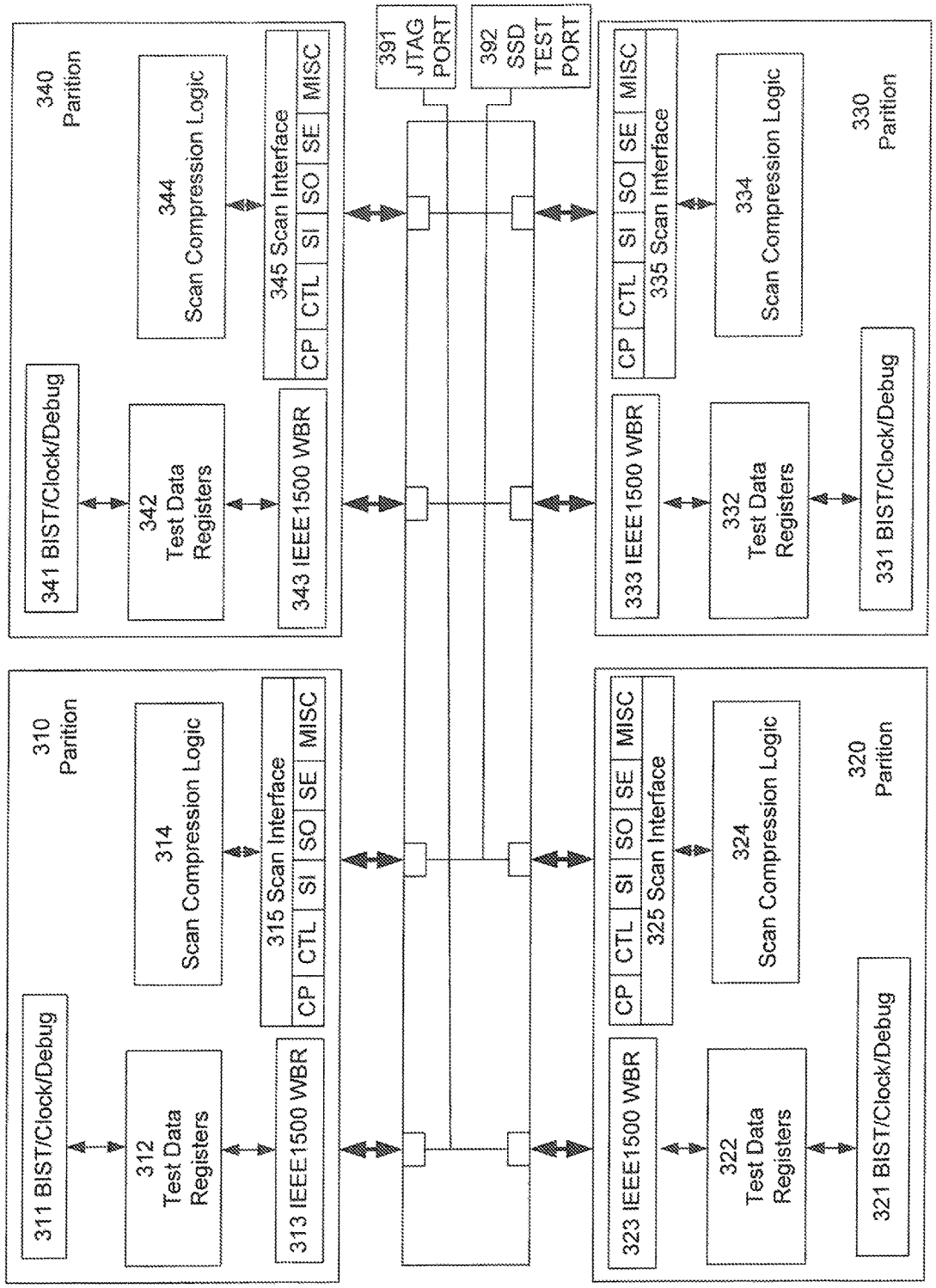
FIG. 3 shows an exemplary system in accordance with one embodiment.

FIG. 3 shows an exemplary system 300 in accordance with one embodiment. Granular dynamic test system 300 includes test partitions 310, 320, 330 and 340 coupled to JTAG port 391 and SSD test port 392. A test partition includes BIST/clock/debug logic (e.g., 311, 321, 331, 341, etc.), test data registers (312, 322, 332, 342, etc.), a IEEE 1500 Wrapper Boundary Register (WBR) cell (e.g., 313, 323, 333, 343, etc.), SCAN compression logic (e.g., 314, 324, 334, 344, etc.) and a scan interface (e.g., 315, 325 335, 345, etc.). The test data registers are coupled to the respective BIST/clock/debug logic, the IEEE 1500 Wrapper Boundary Register (WBR) cell, and the SCAN compression logic which is coupled to the scan interface. A granular dynamic test clock system (not shown) facilitates performance of different types of testing and different test modes in parallel. It is appreciated that without a granular dynamic test clock system, attempts at implementing a traditional IEEE 1500 Wrapper Boundary Register (WBR) approach are problematic.

Granular Dynamic Test Clock Architecture

Figure 4A:
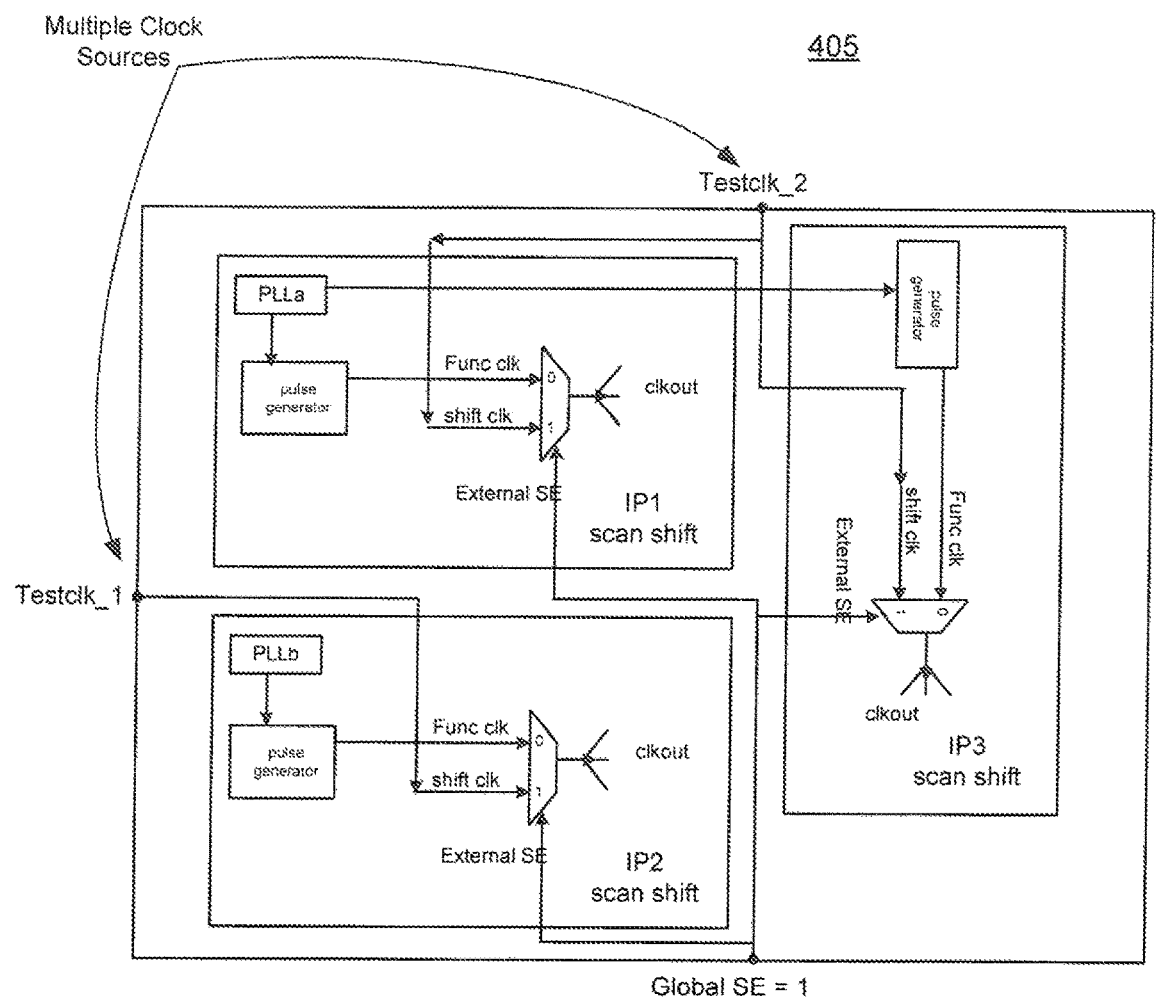
FIG. 4A illustrates one traditional attempt at a traditional clocking architecture in a scan shift mode.
Figure 4B:
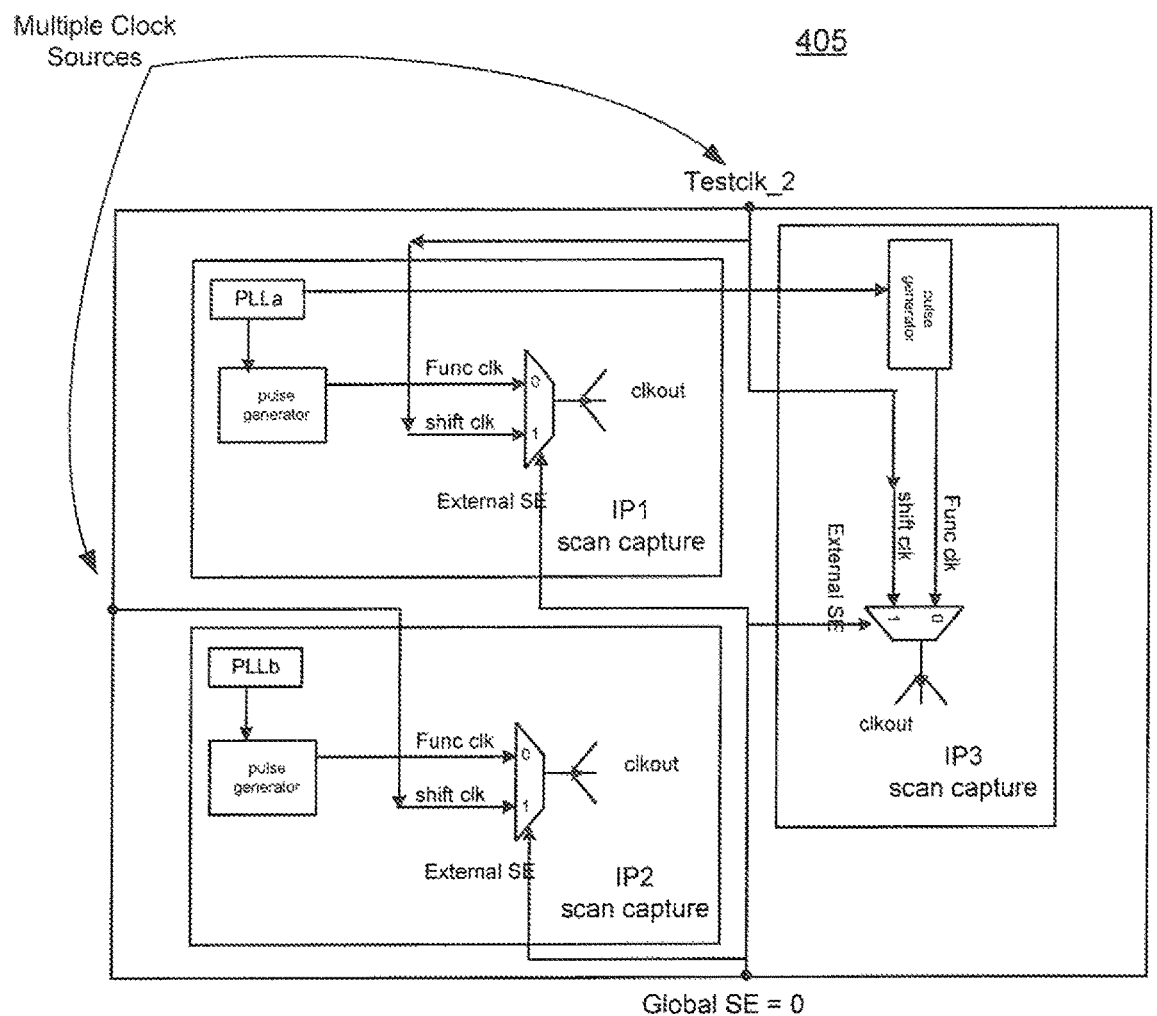
FIG. 4B illustrates one traditional attempt at a traditional clocking architecture in a scan capture mode.

FIG. 4A illustrates one traditional attempt at a traditional clocking architecture 405 in a scan shift mode. FIG. 4B illustrates one traditional attempt at a traditional clocking architecture 405 in a scan capture mode. Traditional clocking architecture 405 is an example of a conventional lock step testing scenario of 3 blocks (e.g., IP1, IP2, IP3, etc.) using conventional Automatic Test Generated Pattern (ATPG) vectors. FIG. 4A shows that the 3 blocks are in scan shift mode (when the external scan enable is a logical 1).

FIG. 4B shows that the 3 blocks are in scan capture mode (when the external scan enable is a logical 0). The lock step inter-dependent approach of conventional clock architectures severely restricts test scheduling and concurrency in a manner that adversely impacts testing speed and resources.

Figure 4C:
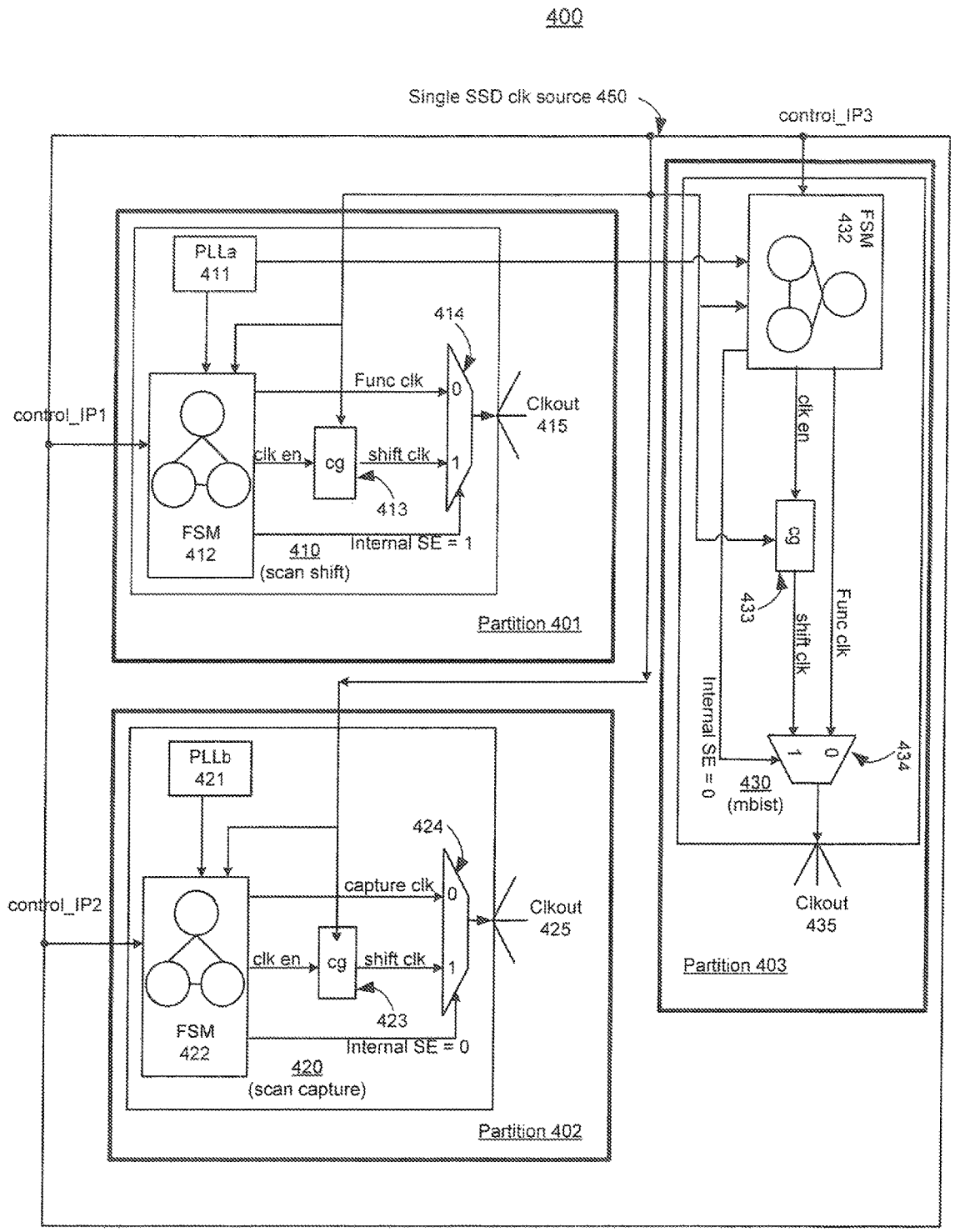
FIG. 4C is a block diagram of an exemplary granular dynamic test system in accordance with one embodiment.

FIG. 4C is a block diagram of an exemplary granular dynamic test system 400 in accordance with one embodiment. FIG. 4C includes a high level schematic of a test partition interface and clocking architecture of granular dynamic test system 400 in accordance with one embodiment. The granular dynamic nature of this architecture supports the execution of different DFT tests across different test partitions with minimal or no inter-dependence. The required clock waveforms for the different test types and modes are derived internally within the partitions. This allows partitions to run or execute different types of tests in parallel and be in different test modes. In one exemplary implementation, partition 401 is executing a scan shift operation while partition 402 is executing a scan capture operation while partition 403 is executing an at-speed MBIST operation.

In one embodiment, a granular dynamic test partition includes a granular dynamic test interface which includes clock controller logic. The clock controller logic can enable a test partition to derive its own scan shift clock and its own scan enable internally. In one exemplary implementation, the granular dynamic test interface clock controller logic (e.g., 410, 420, 430, etc.) includes a finite state machine (FSM) (e.g., 412, 422, 432, etc.), clock gate (e.g., 413, 423, 433, etc.), a glitchless mux (e.g., 414, 424, 424, etc.), and control registers (not shown). Granular dynamic test interface clock control logic can also include a phase lock loop component (e.g., 411, 421, etc.). A phase lock loop component can be shared between partitions, such as sharing of phase lock loop component 411 between partition 401 and partition 403. The finite state machines (FSM) are coupled to the single SSD clock source signal 450, the respective clock gates, glitchless muxes, and PLLs.

Conventional test approaches often utilize multiple external test clock sources servicing respective multiple test bocks. In contrast, a granular dynamic test system and method can include a single clock supplied from an external source from which clock signals for the test partitions are derived internally within the test partitions. The single external test clock source can be a "free running test clock" on the Automatic Test Equipment (ATE) as opposed to controlled test clocks. By opting for a free running test clock and derived test partition clock, there is no longer a requirement to align the various test modes sequentially. The test partitions can execute different types of tests and be in different test modes substantially concurrently or in parallel. In one exemplary implementation, partition 401 is executing a scan shift operation while partition 402 is executing a scan capture operation and partition 403 is executing an at-speed MBIST operation. This paves the way for the re-use of partition designs or IP, physically in a system and also re-use of corresponding ATE patterns.

In one embodiment, test partitions can operate on different test clock signals. The different test clock signals can be coordinated based on different types of tests and test modes. In one embodiment, the test clocks are organized in clock domains corresponding to the test type or test mode (e.g., JTAG clock domain, Scan Test clock domain, MBIST clock domain and IOBIST clock domain, etc). A JTAG clock domain can include a TCK (JTAG clock). A Scan Serializer/Deserializer (SSD) clock domain can include special shift clocks and stuck-at capture pulses. A test clock signal can be sourced from external chip pins. In one exemplary implementation, the externally sourced clocks can be merged internally onto a functional clock network using multiplexors to support various test types and modes of operation. Table I summarizes various types of test and corresponding clocks in accordance with one embodiment.

TABLE I

Clocks used in various DFT modes in test suites.

| DFT Mode | Test Clocks |
| --- | --- |
| JTAG | JTAG CLK |
| SCAN | Functional Clocks, SSD Clocks. |
| MBIST | Functional Clocks. |
| IOBIST | Functional Clocks. |

Some conventional approaches attempt to use a single test clock to drive the scan shift for the blocks but the blocks need to be run in a lock step mode. This typically leads to the addition of padding cycles for blocks with smaller chain lengths, thereby increasing test time. Unlike conventional approaches, in granular dynamic test systems and methods the test partitions no longer need to be tested together or in a sequential manner, but rather can be tested in parallel. A granular dynamic test system and method use of a free running single SSD clock source and derived test partition clocks can facilitate decoupling of testing between test partitions and restrictive limitations associated with lock step approaches. Independence with respect to test type and test mode sequence coordination between partitions facilitates flexible parallel or concurrent execution while maintaining coordination of clock trigger edges. In one embodiment, executing in parallel means at least a portion of test operations in one partition are being executed at the same time as execution of at least a portion of test operations in another partition. In one exemplary implementation, test operations being executed in parallel in different partitions do not necessarily have to start or stop at the same time.

Figure 5A:
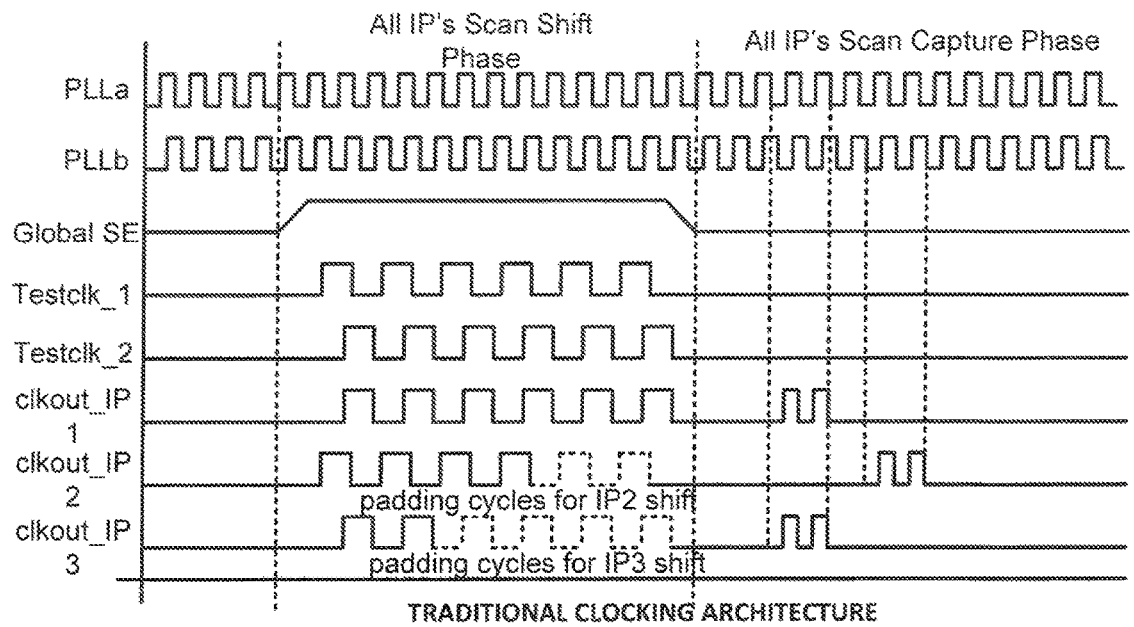
FIG. 5A is a block diagram of a conventional timing diagram.

FIG. 5A is a block diagram of a conventional timing diagram. FIG. 5A shows the timing diagrams for the block's illustrated in FIG. 4A. The block's receive a global SE (scan enable) and either a dedicated or shared external test clock source. The figure shows the controlled external test clock sources (Testclk_1 and Testclk_2) driving the shift clocks in each of the respective block's 1 and 2. The scan shift phase in block 2 and block 3 is shorter and has additional padding cycles to match the longest scan shift phase of block 1. The additional padding cycles are a result of the inter-dependence in lock step execution. In one embodiment, the shared external test clock source Testclk_2 is not free running.

Figure 5B:
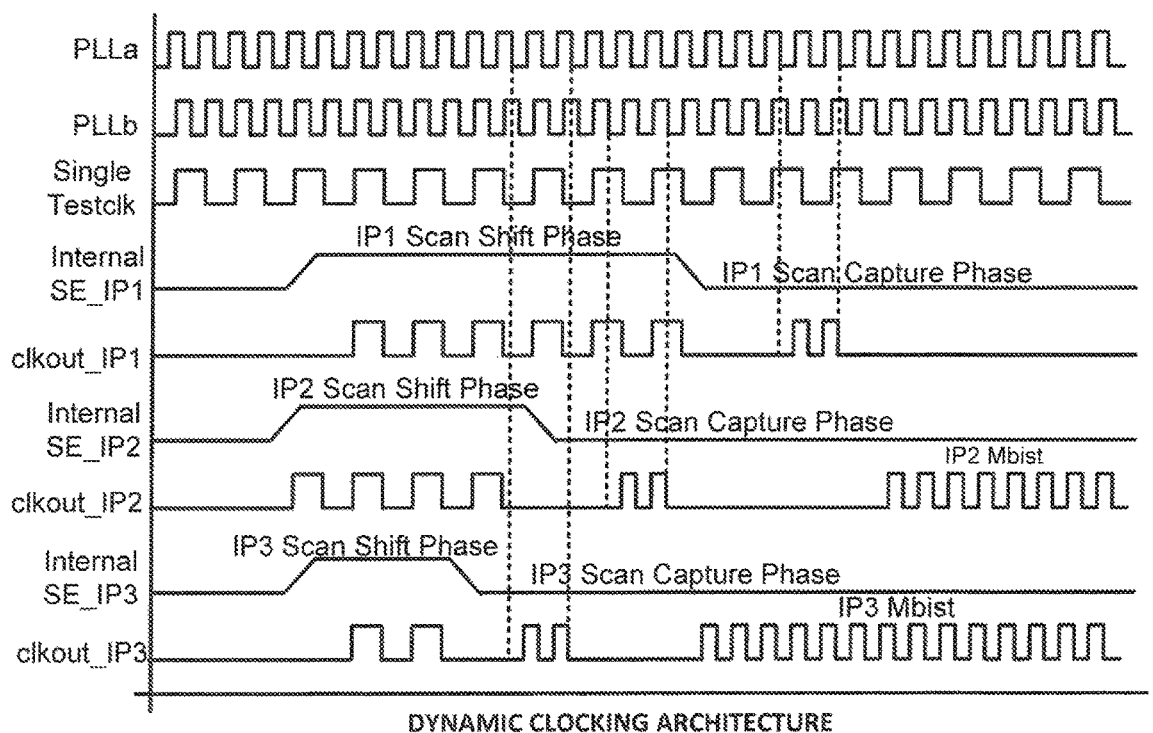
FIG. 5B is a block diagram of an exemplary granular dynamic test timing diagram in accordance with one embodiment.

FIG. 5B is a block diagram of an exemplary granular dynamic test timing diagram in accordance with one embodiment. FIG. 4C shows test partition 4011 is in scan shift while test partition 402 is in scan capture and while test partition 4033 is running mbist vectors. FIG. 5B shows example timing waveforms for the 3 partitions shown in FIG. 4C. The single testclk pin can be considered a free running clock source. As mentioned earlier, each block has its own internal version of SE (scan enable) generated along with its internal scan shift clock. The scan capture clock is generated internally based on the PLL clock source.

Compared to FIG. 5A, the scan shift phase of test partition 402 (clkout_IP2) and test partition 403 (clkout_IP3) waveforms in timing diagram of FIG. 5B do not have padding cycles. The partitions are no longer in lock step and can have separate local sequences for each of the test modes (e.g., scan shift, scan capture, mbist, etc.) which can enable a partition to run its own test sequence that is independent of test sequences in other partitions. As can be seen from FIG. 5B, while test partition 401 is still in its scan shift phase, test partition 402 has completed its conventional scan testing and test partition 403 has already moved onto mbist testing.

Test Pattern Generation Flow

Figure 6:
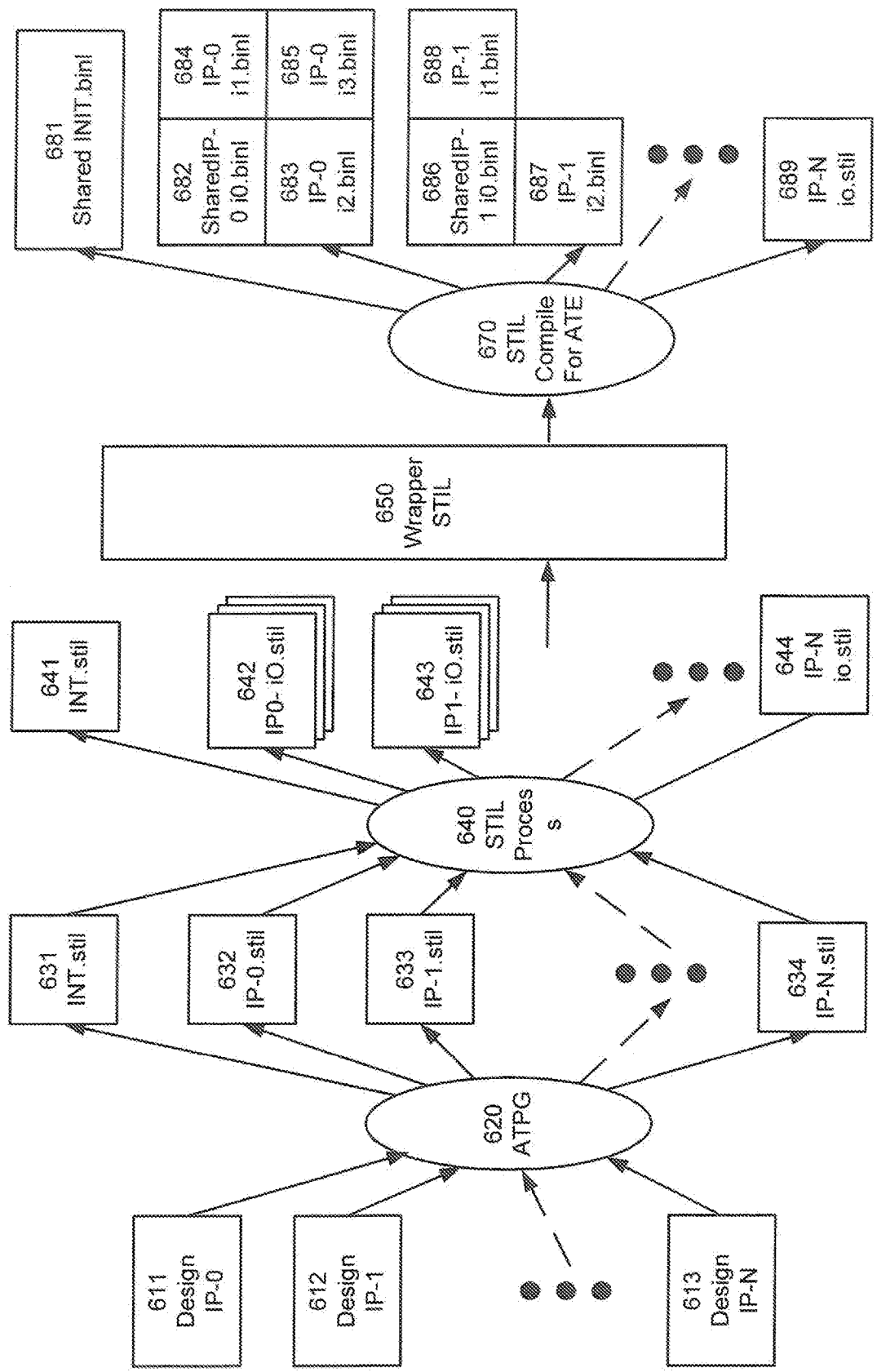
FIG. 6 shows the test pattern generation flow for concurrent testing of multiple test partitions within a given SoC in accordance with one embodiment.

FIG. 6 shows the test pattern generation flow for concurrent testing of multiple test partitions within a given SoC in accordance with one embodiment. Partition design information (e.g., 611, 612, 613, etc.) is fed into the ATPG 620 which outputs initial Standard Test Interface Language (STIL) input information (e.g., 631, 632, 633, etc.). The stil input information is fed into a STIL process 640 which produces sets of STIL input wrapper files (e.g., 641, 642, 643, 644, etc.). STIL Wrapper 650 includes instructions on how to configure the multiple STIL files information into either a concurrent or sequential file formats. STIL compiler 670 compiles the STIL files into a target ATE data base format (e.g., binl files, etc.). In one embodiment, there is a Shared INIT.binl file 681 forwarded for multiple partitions. A first test partition receives binl files including SharedIP-0 i0.binl 682, IP-0 i2.binl 683, IP-0 i1.binl 684 and IP-0 i3.binl 685. A second test partition also receives binl files including SharedIP-1 i0.binl 686, IP-1 i1.binl 688, and IP-1 i2.binl 687. A third test partition can receive binl files, including IP-N i0.stil 689.

The design and development cycle of these multiple blocks can vary greatly from one another. In one embodiment, as and when a test partition design is completed, the test pattern generation is done for that test partition on a test partition level. Before applying the test patterns on ATE, the test patterns at the test partition level are mapped to the SoC level by taking into account the various design variables such as pin connections and reconfiguration from partition to SoC, clock connections, scan data pipeline stages and SSD ratio.

In one embodiment, an internal IEEE1450.1 Standard Test Interface Language (STIL) processing tool called ProcessSTIL can be used to facilitate test pattern generation. Once patterns are processed for a unique test partition, the ProcessSTIL takes care of applying those patterns to the replicated instances of that test partition. These multiple STIL files from multiple test partitions can now be applied in either a concurrent or sequential fashion. To handle this, a STIL Wrapper can be compiled by STIL compiler 670 along with included STIL files into a target ATE data base format (binl files) and finally applied on the ATE (not shown).

Parallel Testing Across Test Partitions

FIG. 7 shows how various test partitions can be tested in parallel at the SoC level in accordance with one embodiment. By using the core based DFT approach set forth above, the inter-dependency across blocks has been removed. The effectiveness of the parallel testing is measured using concurrency efficiency which is defined as a percentage of Tnc/Tc, where Tnc and Tc are the test execution time without and with concurrency respectively. Ideally the concurrency efficiency should be greater than 100% to indicate test time reduction from sequential execution to parallel execution. To achieve that in one exemplary implementation, the setup overhead for individual blocks is removed and a common initialization sequence is used for blocks. Various types of tests are scheduled optimally in pattern bursts on ATE aiming for minimum unused channel resources in a tester.

Figure 7A:
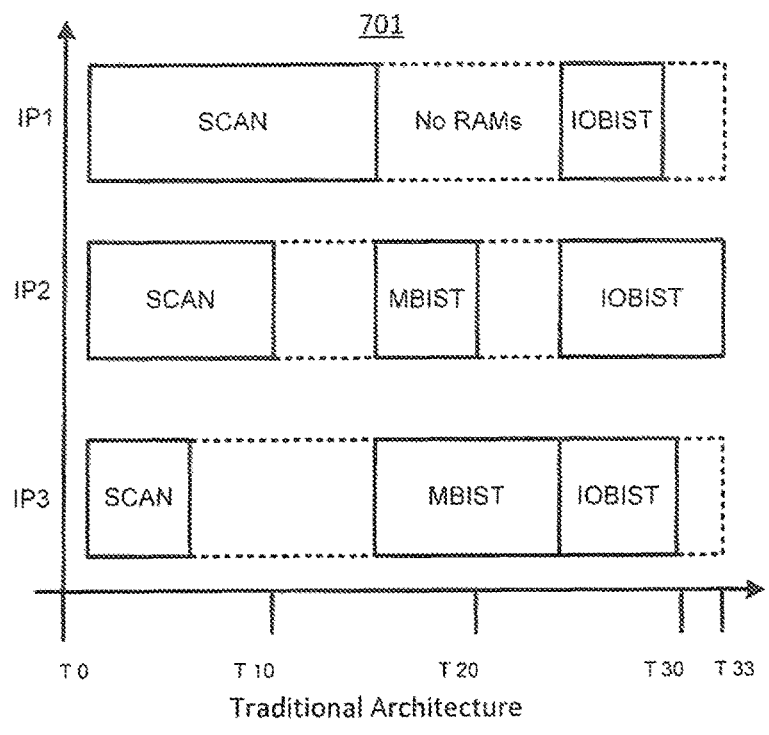
FIG. 7A shows the sequential test scheduling using an example of a traditional test architecture for 3 different blocks.

FIG. 7A shows the sequential test scheduling 701 using an example of traditional test architecture 405 for 3 different blocks. In this example, the individual blocks are either performing different types of tests or are in different test modes, and one block takes a longer test time while the other two blocks complete the test operations sooner. The overall test time for these 3 block's is denoted by T33.

Figure 7B:
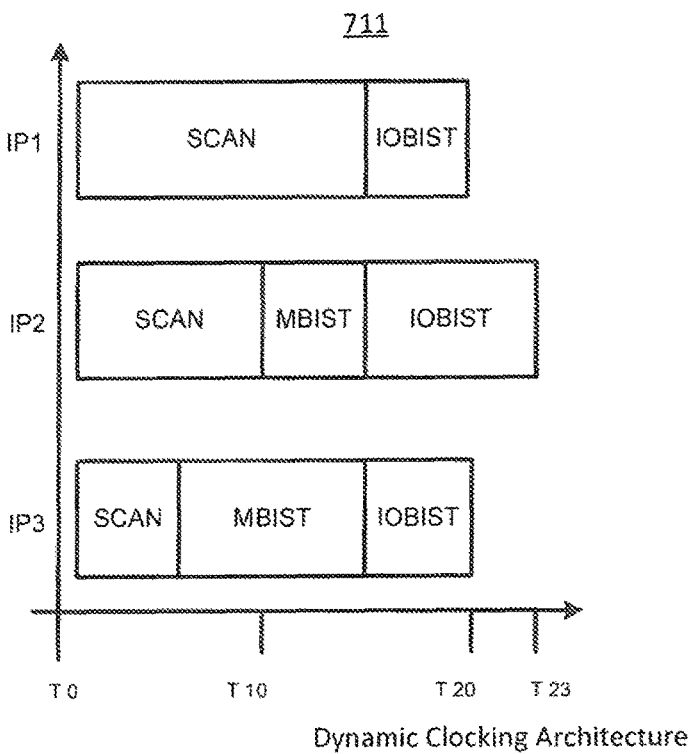
FIG. 7B shows an exemplary scheduling for a granular dynamic test system in accordance with one embodiment.

FIG. 7B shows an exemplary scheduling 711 for granular dynamic test system 400 in accordance with one embodiment. In comparison with FIG. 7A, FIG. 7B illustrates the idle states are no longer present and the overall test time for testing the functional circuitry is reduced to T23. This reduction can be achieved in test time since each test partition can now derive its own test clock based off of the free running external test clock source. The test partitions can now schedule their respective tests independently. In the conventional test clocking architectures, each block is typically forced to run in a lock step mode due to inter dependence of test clocks distributed across the block's.

Figure 8:
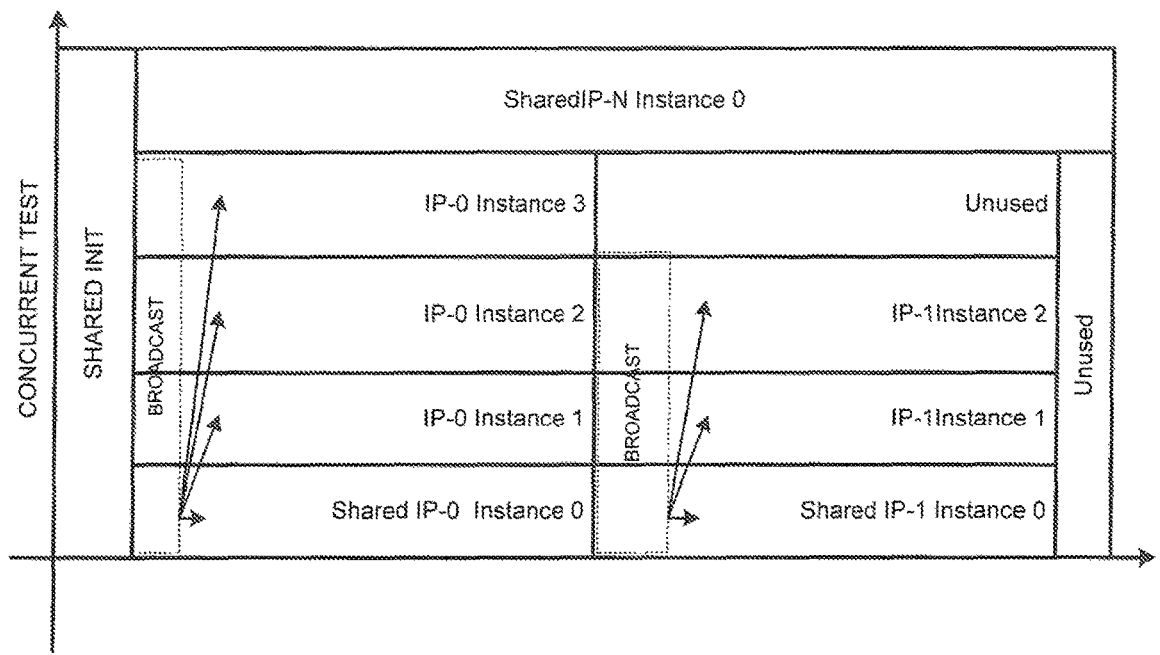
FIG. 8 is a diagram of exemplary concurrent testing in accordance with one embodiment.

A test partition can have its own test pattern set. As indicated above with reference to FIG. 1, some test partitions can have very similar designs and IP and correspondingly the similar test partitions can share similar test patterns. Different instance of a single similar test pattern can be used to test different test partitions. The different test pattern instances can be used in parallel by the similar test partitions. FIG. 8 is a diagram of exemplary concurrent testing in accordance with one embodiment. The different instances (instance 0 through instance 3) of shared IP-0 are broadcast to different respective test partitions and tested in parallel. Different instances (instance 0 through instance 2) of shared IP-1 are also broadcast to different respective test partitions and tested in parallel.

FIG. 9 is a block diagram of exemplary test method 900 in accordance with one embodiment.

In block 910, a test mode selection for a first partition is accessed. A free running clock is supplied to the first partition and second partition. A first test clock for the first partition is derived from the free running clock independent of a second test clock for the second partition, and the second test clock for the second partition is derived from the free running clock independent of the first clock for the first partition.

In block 920, testing of the first partition is controlled in accordance with the test mode selection for the first partition independent of a test mode selection for a second partition. In one embodiment, the test mode selection for the first partition is different than the test mode selection for the second partition.

In block 930, test operations are performed in the first partition in accordance with the controlling. In one embodiment, at least a portion of the test operations are performed in the first partition concurrently with a portion of test operations in the second partition. A first type of test vectors is supplied to the first partition and a second type of test vectors is supplied to the second partition. The test operations of the first partition are scheduled independent of the test operation of the second partition. The test operations of the first partition are in a different phase than test operations of the second partition.

Improved Test Performance

Granular dynamic test systems and methods can facilitate improved performance. The improved test performance can include shorter testing time, test partition design and intellectual property (IP) reuse, corresponding partition test pattern reuse, less consumption of external pins for testing operations, reduced engineering efforts and costs, faster time to market, conservation of resources, and so on.

Shortened Testing Time

Traditional test architectures are often limited to sequential block level testing due to inter dependence of shared test clocks distributed across test blocks. The conventional sequential testing approach typically leads to inefficient test scheduling and longer test time (e.g., refer to FIG. 7A). Granular dynamic test systems and methods enable independent and parallel test partition operations. By having the test partitions independently tested in parallel, better test scheduling can be achieved. Improved test scheduling facilitates shorter overall test time (e.g., see comparison illustrated in exemplary FIGS. 7A and 7B). The reduced test time can be directly proportional to test cost reductions that lead to increased gross margins for chips.

Pattern Reuse

In one embodiment, a granular dynamic test system and method can enable individual test partitions to have their own set of ATPG vectors. A test partition can have its own set of ATPG vectors, even if the set of ATPG vectors are an instance of a shared ATPG vector pattern. The granular dynamic test systems and methods facilitate test pattern reuse for test partitions with similar designs or IP on a partition basis (both within a chip and across multiple chips). In the conventional test scenarios, the test block's are not typically fully isolated from one another and this limits the reuse of test vectors across blocks. In one embodiment, at least some aspects of a partition in a granular dynamic test systems and method can be isolated from other partitions, thereby facilitating reuse of similar or the same test vectors. In one exemplary implementation, it is estimated granular dynamic approach can reduce the bring-up/characterization time for block's that are reused on the same process node by approximately 15%. This reuse of test patterns and vectors can result in a significant reduction in 'time-to-market' as there is little or no need to regenerate and re-characterize the test vectors on Silicon.

Engineering Savings

Both concurrent testing and pattern reuse provide for greater savings in engineering resources and costs. In conventional architectures, with multiple test clocks (e.g., 20 plus clocks, etc.) significant engineering efforts were typically required for test clock assignment, grouping, distribution, timing, etc. across various cross functional teams (e.g., DFT, Clocks, PD, PnR & Timing, etc). With granular dynamic test systems and methods, engineering efforts and costs can be significantly lowered from each of these cross functional teams while achieving improved testing goals. In one embodiment, granular dynamic test system and method control logic includes an interface that is standard or substantially common to multiple test partitions, which facilitates easier integration of the multiple test partitions in an SOC.

Reduced Pin Count

The use of a single free running test clock source in a granular dynamic test system and method can facilitate a reduction of external chip pins dedicated to testing as compared to conventional approaches. By using a single free running test clock source in place of multiple controlled test clocks, the clock pin count can be reduced. In one embodiment, the number of DFT clock pins required is reduced by 80% relative to traditional architectures. The reduction in the number of dedicated test pins can reduce the number of clock channels on the ATE testers. These freed up channels can be assigned for other test related tasks which in turn promotes greater multi-site testing (the simultaneous testing of multiple chip die's on a single tester at a given time). The reduced test pin requirements and multi-site testing in turn facilitate faster overall test time and low overall test costs.

Coordinating Test Clock Staggering Across Partitions.

In one embodiment, a granular dynamic test system and method is coordinated with partition test clock stagger functionality. The partition test clock stagger functionality can stagger test clock edges across different test partitions. In one embodiment, the test clock stagger is coordinated for peak power reduction and power budget compliance.

Figure 10:
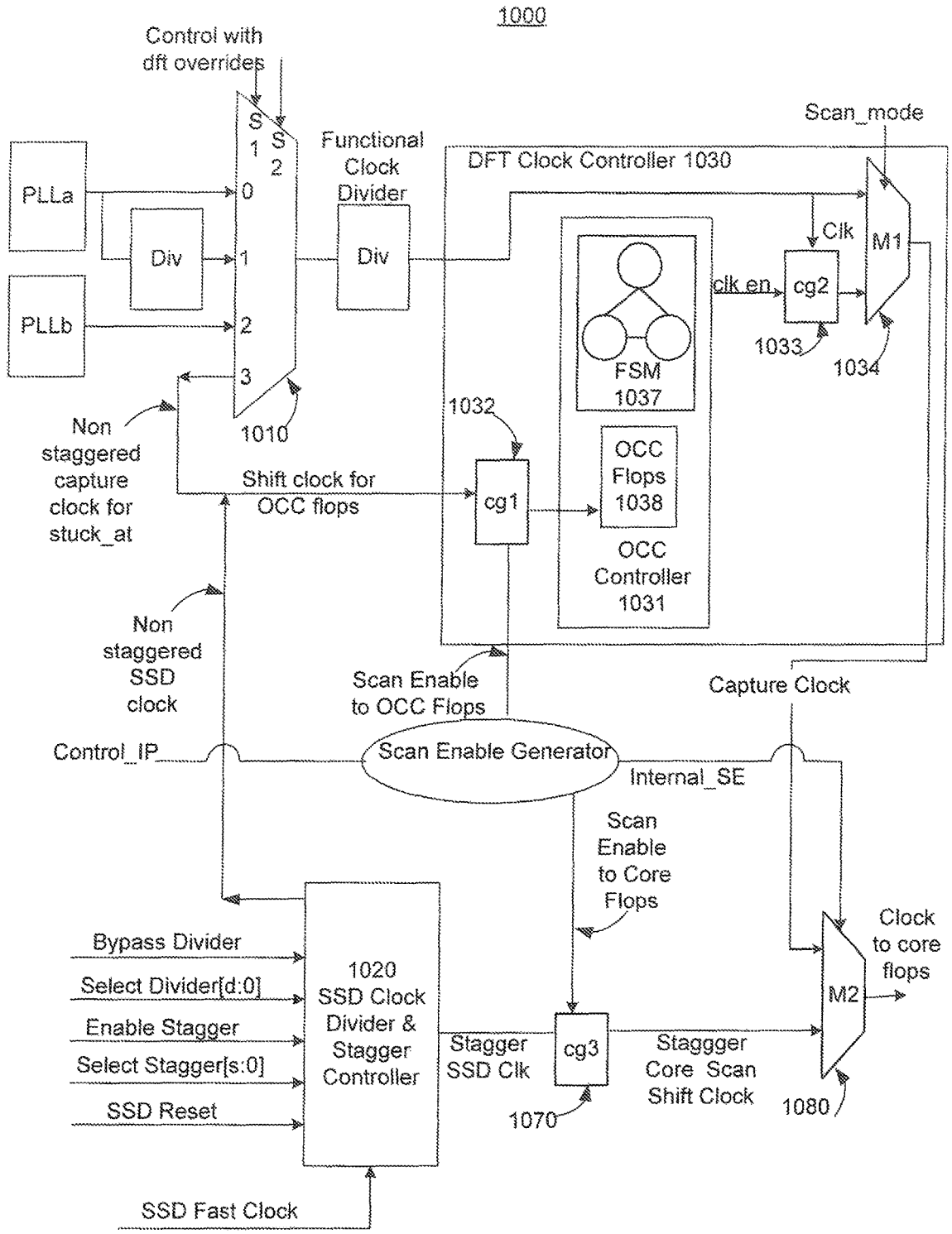
FIG. 10 is a block diagram of an exemplary abstracted clocking architecture schematic in accordance with one embodiment.

FIG. 10 is a block diagram of an exemplary abstracted clocking architecture schematic in accordance with one embodiment. The 4:1 clock MUX selects either a functional clock (e.g., PLLa, a division of PLLa, PLLb, etc.) or a Non Staggered SSD clock. The SSD Clock Divider & Stagger Controller (SSD clock controller) 1020 provides a Staggered SSD Clock for core shift operation and a Non Staggered SSD Clock for On-Chip-Clock (OCC) chain shift and stuck-at capture operation for core chains. DFT clock controller 1030 includes the OCC controller 1038 and supporting logic (e.g., clock gaters—cg1, cg2 and mux M1) to provide the capture clock for ATPG patterns. The scan enable generator block generates the localized scan enable for OCC flops (SE to OCC flops) and scan enable for Core flops (SE to Core flops). These scan enable signals gate the SSD clock outputs out of the SSD clock controller to generate the required number of shift pulses for OCC flops and Core flops. The other modes of MBIST and IOBIST can use the functional PLL clocks, which passes through leg 0 of the mux M1.

Based on the values loaded into the OCC flops, the Finite State Machine (FSM) inside the OCC controller generates the clk_en signal to gate the capture clock source (using clock gater cg2) and generate the required number of capture pulses for ATPG patterns. The resultant Capture_clk then drives the leg 0 of mux M2. The Shift_clk is sourced from the output of clock gater cg3 (Staggered Core Chain Shift Clock) and drives leg 1 of the mux M2. The signal Internal_SE controls the switching between the shift and capture clocks accordingly. For the MBIST and IOBIST patterns, the signal Internal_SE is 0 and allows the functional PLL clock to flow through.

It is appreciated that granular dynamic test systems and methods can be coordinated with other test system operations. In one embodiment, Scan Serializer/Deserializer (SSD) is a time-division demultiplexing/multiplexing based scan architecture. It uses a small number of pins that interface with ATE and shift serial scan data at higher speeds. Load blocks or deserializers, are used before sending this data to Pseudo Scan Inputs (PSIs) at a lower frequency. Similarly Pseudo Scan Outputs (PSOs) send the scan data to unload blocks or serializers, before it reaches top level pins. In one exemplary implementation of an N:1 SSD ratio, an SSD fast clock runs at N times the speed of internal shift frequency.

With reference back to FIG. 2, in one embodiment, operations within a component of system 200 can be coordinated with various other components and features of system 200, external interfaces and components within a test partition. In one embodiment, a UFI and test clock generation is coordinated with DSTA serialization and deserialization operations.

Additional information regarding a Ultra Fast Interface (UFI) is set forth in related co-pending application Ser. No. 15/336,716, entitled Granular Dynamic Test Systems and Methods filed on Oct. 27, 2016, which is incorporated herein by reference.

Additional information regarding DSTA is set forth in related co-pending application Ser. No. 15/336,736, entitled Dynamic Scan Test Access (DSTA) filed on Oct. 27, 2016, which is incorporated herein by reference.

Additional information regarding coordination of external pad configuration is set forth in related co-pending application Ser. No. 15/336,687, entitled Test Partition External Input/Output Interface Control filed on Oct. 27, 2016, which is incorporated herein by reference.

Additional information regarding on-line test operations and JTAG test operations is set forth in related co-pending application Ser. No. 15/336,747, entitled Scan System Interface (SSI) filed on Oct. 27, 2016, which is incorporated herein by reference.

Additional information regarding test partition clock staggering and peak power reduction is set forth in related co-pending application Ser. No. 15/336,676, entitled Independent Test Partition Clock Coordination Across Multiple Test Partitions filed on Oct. 27, 2016, which is incorporated herein by reference.

The granular dynamic test systems and methods can be used in a variety of applications (e.g., CPUs, GPUs, mobile device SoCs, etc.). The granular dynamic test systems and methods can be used for both production testing and on-line testing. The production testing can be directed to finding manufacturing defects and the on-line testing can be directed to finding errors that develop after product shipment. The granular dynamic testing systems and methods support testing features for external testing (e.g., testing with Automatic Test Equipment (ATE)) as well as on system internal testing.

A granular dynamic test system and method can allow parallel testing of multiple test partitions in a given SoC. It also enables greater multi-site testing opportunities to further lower the test cost. The granular dynamic test systems and methods can include a dynamic test clock architecture that eliminates or reduces the interdependency in clocking across blocks and allows substantially concurrent yet independent testing of a block with its own pattern set. The granular dynamic test system and method architecture contributes to significant reduction of test application time by improving the scan shift frequency and efficiently utilizing the ATE resources by optimally scheduling various tests.

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical or quantum computing device) that manipulates and transforms data represented as physical (e.g., electronic) quantities. The terms refer to actions and processes of the processing devices that manipulate or transform physical quantities within a computer system's component (e.g., registers, memories, other such information storage, transmission or display devices, etc.) into other data similarly represented as physical quantities within other components.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as suited to the particular use contemplated. It is intended that the scope of the invention be defined by the Claims appended hereto and their equivalents. The listing of steps within method claims do not imply any particular order to performing the steps, unless explicitly stated in the claim.

What is claimed is:

1. A chip test system comprising:
a plurality of test partitions, wherein at least one of the plurality of test partitions comprises:
a partition test interface controller configured to control testing within the at least one test partition in accordance with dynamic selection of a test mode from a plurality of test modes, wherein the dynamic selection of the test mode and control of testing within the at least one of the plurality of test partitions is independent of selection of a test mode and control in others of the plurality of test partitions; and
a test chain configured to perform test operations, the test scan test chain coupled to the partition test interface controller; and
a centralized controller configured to coordinate testing between the plurality of test partitions, wherein the coordination includes managing communication of test information between the plurality of test partitions and external pins.

2. The chip test system of claim 1, wherein a free running clock signal coupled to the at least one test partition, and the partition test mode controller transforms the free running clock signal into a local partition test clock which is controlled in accordance with the dynamic selection of the test mode.

3. The chip test system of claim 1, wherein the partition test interface controller generates a local partition scan enable signal, scan shift clock signal, and scan capture clock signal.

4. The chip test system of claim 1, wherein the test operations are associated with a Joint Test Action Group (JTAG) test.

5. The chip test system of claim 1, wherein the test operations are associated with a scan test.

6. The chip test system of claim 1, wherein the test operations are associated with a Memory Built In Self Test (MBIST).

7. The test system of claim 1, wherein the test operations are associated with an Input/Output Built In Self Test (IOBIST).

8. The test system of claim 1, wherein the partition test interface controller comprises a finite state machine and a clock gate.

9. A test system comprising:
a first test partition means configured to execute a first test pattern;
a second test partition means configured to execute a second test pattern, wherein the second test partition means executes at least a portion of the second test pattern in parallel with execution of at least a portion of the first test pattern on the first test partition means, and the portion of the second test pattern and the portion of the first test pattern are associated with different test modes selected from a plurality of test modes; and
a centralized controller means configured to coordinate testing between the plurality of test partition means, wherein the coordination includes managing communication of test information between the plurality of test partitions means and external pins.

10. The test system of claim 9, wherein the second test partition means includes a test partition interface controller means coupled to a free running clock signal from a single external pin, wherein the test partition interface controller means derives a local test clock signal that is different than the free running clock signal.

11. The test system of claim 9, wherein the second test pattern is reused for a third test partition means that has a shared partition design with the second test partition means.

12. The test system of claim 9, wherein test operations associated with different test modes are aligned non-sequentially between the first test partition means and the second test partition means.

* * * * *